United States Patent
Yun et al.

(10) Patent No.: US 11,056,193 B2
(45) Date of Patent: Jul. 6, 2021

(54) NON-VOLATILE MEMORY DEVICES HAVING ENHANCED ERASE CONTROL CIRCUITS THEREIN

(71) Applicant: Samsung Electronics Co., Ltd., Suwon-si (KR)

(72) Inventors: Se-Won Yun, Hwaseong-si (KR); Jin-Young Kim, Seoul (KR); Il-Han Park, Suwon-si (KR); Hyun Seo, Goyang-si (KR); Bong-Soon Lim, Seoul (KR)

(73) Assignee: Samsung Electronics Co., Ltd.

( * ) Notice: Subject to any disclaimer, the term of this patent is extended or adjusted under 35 U.S.C. 154(b) by 102 days.

(21) Appl. No.: 16/442,672

(22) Filed: Jun. 17, 2019

(65) Prior Publication Data
US 2019/0385681 A1     Dec. 19, 2019

(30) Foreign Application Priority Data

Jun. 18, 2018   (KR) .......................... 10-2018-0069630

(51) Int. Cl.
| | |
|---|---|
| *G11C 16/16* | (2006.01) |
| *G11C 16/04* | (2006.01) |
| *H01L 27/11582* | (2017.01) |
| *G11C 11/56* | (2006.01) |

(52) U.S. Cl.
CPC .......... *G11C 16/16* (2013.01); *G11C 16/0483* (2013.01); *G11C 11/5671* (2013.01); *H01L 27/11582* (2013.01)

(58) Field of Classification Search
CPC . G11C 16/16; G11C 16/0483; G11C 11/5671; G11C 16/08; G11C 16/3445; G11C 16/24; G11C 16/32; G11C 16/14; H01L 27/11582; H01L 27/11565
See application file for complete search history.

(56) References Cited

U.S. PATENT DOCUMENTS

| | | | |
|---|---|---|---|
| 7,269,070 B2 | 9/2007 | Kim | |
| 8,923,054 B1 * | 12/2014 | Costa | ..................... G11C 16/16 365/185.11 |
| 9,015,407 B1 | 4/2015 | Ousija et al. | |
| 9,214,240 B2 | 12/2015 | Outta et al. | |
| 9,437,307 B2 | 9/2016 | Itagaki et al. | |
| 9,449,698 B1 | 9/2016 | Paudel et al. | |
| 9,490,019 B2 | 11/2016 | Itagaki | |
| 9,786,378 B1 | 10/2017 | Zhang et al. | |

(Continued)

*Primary Examiner* — Jay W. Radke
(74) *Attorney, Agent, or Firm* — Myers Bigel, P.A.

(57) ABSTRACT

A memory device includes an array of vertical NAND strings of nonvolatile memory cells, on an underlying substrate. An erase control circuit is provided, which is configured to drive a plurality of bit lines electrically coupled to the array of vertical NAND strings of nonvolatile memory cells with respective erase voltages having unequal magnitudes during an operation to erase the nonvolatile memory cells in the array of vertical NAND strings. This erase control circuit may also be configured to drive a first of the plurality of bit lines with a first erase voltage for a first duration and drive a second of the plurality of bit lines with a second erase voltage for a second duration unequal to the first duration during the operation to erase the nonvolatile memory cells in the array of vertical NAND strings.

20 Claims, 18 Drawing Sheets

(56) References Cited

U.S. PATENT DOCUMENTS

| | | |
|---|---|---|
| 9,875,800 B2 | 1/2018 | Lee |
| 2009/0185441 A1* | 7/2009 | Kux .................... G11C 29/028 365/218 |
| 2012/0224426 A1* | 9/2012 | Nam .................. G11C 16/0483 365/185.11 |
| 2017/0372789 A1 | 12/2017 | Ray et al. |

* cited by examiner

FIG. 4A

| ERASE BIAS for BLK1 | |
|---|---|
| V_BL | V_ERS |
| V_WL | Vwe |
| V_SSL | Vbias |
| GSL | FLOAT |
| CSL | FLOAT |

NON-VOLATILE MEMORY DEVICES HAVING ENHANCED ERASE CONTROL CIRCUITS THEREIN

REFERENCE TO PRIORITY APPLICATION

This application claims the benefit of Korean Patent Application No. 10-2018-0069630, filed Jun. 18, 2018, the disclosure of which is hereby incorporated herein by reference in its entirety.

BACKGROUND

The inventive concept relates to non-volatile memory devices and, more particularly, to non-volatile memory devices having erase control circuits therein.

Recently, as information communication devices have become more multifunctional, there is a demand for increasing capacity and integration of memory devices. As memory cell size is reduced to achieve higher integration, the operating circuits and/or wiring structures within the memory devices, which control operation and electrical connection of circuits therein, are becoming more complex. Accordingly, there is a demand for memory devices having improved electrical characteristics and reliability of data with increased integration.

SUMMARY

Non-volatile memory devices, including those having vertical NAND-type structures, utilize erase control circuits to achieve improve operating characteristics. In some embodiments of these memory devices, an array of non-volatile memory cells is provided having a plurality of groups of non-volatile memory cells therein. In addition, at least a first bit line is provided, which is electrically coupled to a first of the plurality of groups of non-volatile memory cells, and at least a second bit line is provided, which is electrically coupled to a second of the plurality of groups of non-volatile memory cells. An erase control circuit is provided, which is configured to drive the at least a first bit line and the at least a second bit line with unequal first and second erase voltages during an operation to erase the first of the plurality of groups of non-volatile memory cells and the second of the plurality of groups of non-volatile memory cells, respectively.

In some embodiments of the invention, the non-volatile memory cells in the first of the plurality of groups of non-volatile memory cells are arranged vertically relative to each other, on an underlying substrate. For example, the array of non-volatile memory cells may include a plurality of vertical NAND-type strings of memory cells having respective vertical channel structures electrically coupled to corresponding bit lines. In addition, the erase control circuit may be configured to advantageously drive a plurality of the bit lines with unequal erase voltages during an operation to erase the plurality of vertical NAND strings of memory cells, and so that the memory cells have more uniform erase characteristics (e.g., threshold voltages). In some of these embodiments of the invention, the unequal erase voltages include a first erase voltage and a second erase voltage having unequal magnitudes, and the erase control circuit is configured to drive a first of the plurality of bit lines with the first erase voltage for a first duration and a second of the plurality of bit lines with the second erase voltage for a second duration during an operation to erase the plurality of vertical NAND strings of memory cells. This first duration may be shorter than the second duration and a magnitude of the first erase voltage may be less than a magnitude of the second erase voltage. In some further embodiments of the invention, a word line cut region may be provided on the semiconductor substrate, and the first of the plurality of groups of non-volatile memory cells may extend closer to the word line cut region relative to the second of the plurality of groups of non-volatile memory cells.

According to additional embodiments of the invention, a memory device is provided that includes an array of vertical NAND strings of nonvolatile memory cells, on an underlying substrate. In addition, an erase control circuit is provided, which is configured to drive a plurality of bit lines electrically coupled to the array of vertical NAND strings of nonvolatile memory cells with respective erase voltages having unequal magnitudes during an operation to erase the nonvolatile memory cells in said array of vertical NAND strings. In some of these embodiments of the invention, the erase control circuit is configured to drive a first of the plurality of bit lines with a first erase voltage for a first duration and drive a second of the plurality of bit lines with a second erase voltage for a second duration unequal to the first duration during the operation to erase the nonvolatile memory cells in said array of vertical NAND strings.

According to additional embodiments of the invention a non-volatile memory device is provided, which includes a substrate and a memory cell array. The memory cell array includes a plurality of vertical channel structures spaced arranged apart from one another in a first direction and a second direction perpendicular to the first direction and extending in a direction perpendicular to the substrate. A plurality of bit lines are provided, which extend in the second direction and are electrically connected to a respective one end of the vertical channel structures. An erase control circuit is provided, which is configured to form a plurality of groups including at least two of the bit lines and to apply erase voltages different from each other to two or more of the groups, during an erase operation for the memory cell array.

According to additional embodiments, there is provided a non-volatile memory device including a plurality of memory blocks disposed in a first direction and a second direction perpendicular to the first direction and each including a plurality of pillars extending in a direction perpendicular to a substrate. A plurality of bit lines are provided, which extend in the second direction on the memory blocks and are electrically connected to the pillars. One or more word line cut regions may be formed on the substrate, which extend in the first direction. Control logic is provided for outputting an erase voltage control signal during an erase operation for the memory blocks. An erase control circuit is also provided, which is configured to form a first group and a second group each including at least two of the bit lines and configured to apply different erase voltages to the first group and the second group based on the erase voltage control signal.

In some additional embodiments of the invention, a non-volatile memory device is provided that includes a plurality of memory blocks, with each of the memory blocks including a plurality of gate conductive layers stacked on a substrate and a plurality of vertical channel structures extending vertically from a top surface of the substrate through the gate conductive layers. A plurality of bit lines are also provided, which are arranged on the memory blocks in a first direction and extend in a second direction perpendicular to the first direction. These bit lines are electrically connected to the vertical channel structures. A voltage generator is provided, which is configured to generate a bit line voltage applied to the bit lines. Control logic is also provided for outputting an erase voltage control signal during an erase operation for the memory blocks. An erase control circuit is provided, which is configured to apply different erase voltages to respective bit lines (associated with different groups of memory cells) during an erase operation.

BRIEF DESCRIPTION OF THE DRAWINGS

FIG. 4A is a table and FIG. 4B is a timing diagram that illustrate erase operations according to an embodiment of the invention;

DETAILED DESCRIPTION OF THE EMBODIMENTS

Figure 1:
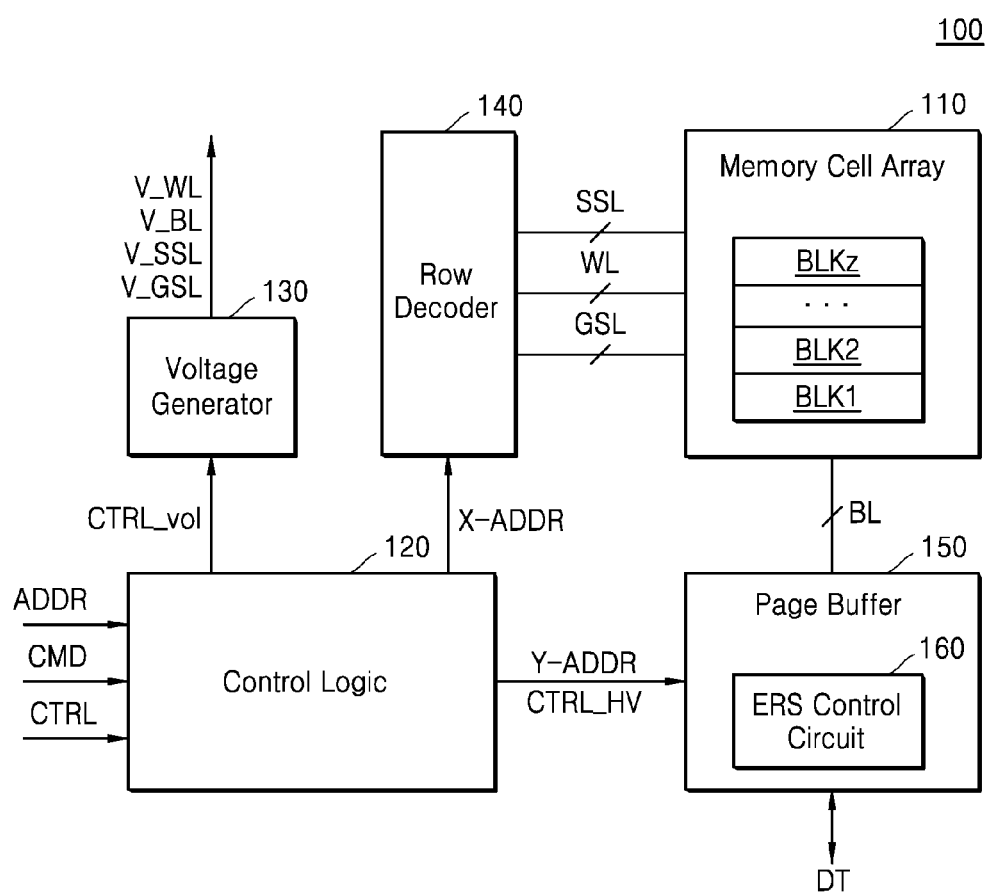
FIG. 1 is a block diagram of an integrated circuit memory device with erase control circuit, according to an embodiment of the invention.

FIG. 1 is a block diagram showing a memory device according to an example embodiment. Referring to FIG. 1, a memory device 100 may include a memory cell array 110, a control logic 120, a voltage generator 130, a row decoder 140, a page buffer 150, and an erase control circuit 160. Although not shown in FIG. 1, the memory device 100 may further include a data input/output circuit, an input/output interface, and the like. Also, although not shown, the memory device 100 may further include various sub-circuits like an error correction circuit for correcting errors of data read from the memory cell array 110.

The memory cell array 110 includes a plurality of memory cells and may be connected to string select lines SSL, word lines WL, ground select lines GSL, and bit lines BL. In detail, the memory cell array 110 may be connected to the row decoder 140 via the string select lines SSL, the word lines WL, and the ground select lines GSL and may be connected to the page buffer 150 via the bit lines BL.

For example, the memory cells included in the memory cell array 110 may be non-volatile memory cells capable of maintaining data stored therein even when power supply is interrupted. In detail, when the memory cells are non-volatile memory cells, the memory device 100 may be electrically erasable programmable read-only memory (EEPROM), a flash memory, phase change random access memory (PRAM), resistive random access memory (RRAM), a nano floating gate memory (NFGM), polymer random access memory (PoRAM), magnetic random access memory (MRAM), ferroelectric random access memory (FRAM), etc. Hereinafter, example embodiments will be described by taking a case where a plurality of memory cells are NAND flash memory cells as an example, but the inventive concept is not limited thereto.

The memory cell array 110 includes a plurality of memory blocks BLK1 to BLKz, and each of the memory block BLK1 to BLKz may have a planar structure or a three-dimensional structure. The memory cell array 110 may include at least one of a single level cell block including single level cells (SLC), a multilevel cell block including multilevel cells (MLC), a triple level cell block including triple level cells (TLC), and a quad level cell block including quad level cells (QLC). For example, some of the memory blocks BLK1 to BLKz may be single level cell blocks, and the other memory blocks may be multilevel cell blocks, triple level cell blocks, or quad level cell blocks.

The control logic 120 may, based on a command CMD, an address ADDR, and a control signal CTRL, output various control signals for programming data to the memory cell array 110, reading out data from the memory cell array 110, or erasing data stored in the memory cell array 110, e.g., a voltage control signal CTRL_vol, a row address X-ADDR, and a column address Y-ADDR. For example, the control logic 120 may receive a command CMD, an address ADDR, and a control signal CTRL from a memory controller (not shown) outside the memory device 100. Therefore, the control logic 120 is capable of controlling various operations in the memory device 100.

According to an example embodiment, the control logic 120 may further output an erase voltage control signal CTRL_HV to the erase control circuit 160. For example, the control logic 120 may output an erase voltage control signal CTRL_HV to one or more transistors included in a group including a bit line to which an erase voltage is to be applied from among the bit lines BL.

The voltage generator 130 may generate various types of voltages for performing program, read, and erase operations on the memory cell array 110 based on the voltage control signal CTRL_vol. In detail, the voltage generator 130 may generate a word line voltage V_WL, e.g., a program voltage, a read voltage, a pass voltage, an erase verify voltage, or a program verify voltage. Furthermore, the voltage generator 130 may generate a string select line voltage V_SSL and a ground select line voltage V_GSL based on the voltage control signal CTRL_vol.

Furthermore, the voltage generator 130 may generate a bit line voltage V_BL based on the voltage control signal CTRL_vol. For example, the voltage generator 130 may generate a gate induced drain leakage (GIDL) voltage and an erase voltage as bit line voltages V_BL. According to an example embodiment, the voltage generator 130 may generate a plurality of erase voltages having different levels. According to another example embodiment, the voltage generator 130 may generate a plurality of erase voltages having different application times. Detailed descriptions thereof will be described below.

The row decoder 140 may select one of the memory blocks BLK1 to BLKz in response to the row address X-ADDR and may select one of the word lines WL of the selected memory block and select one of the string select lines SSL. The row decoder 140 may also transmit a voltage for performing a memory operation to word lines of the selected memory block. For example, in an erase operation, the row decoder 140 may transmit an erase voltage and a verify voltage to a selected word line and transmit a pass voltage to an unselected word line.

The page buffer 150 may transmit and receive data DT with a device outside the memory device 100. The page buffer 150 may select some of the bit lines BL in response to the column address Y-ADDR. The page buffer 150 may operate as a write driver or a sense amplifier.

The erase control circuit 160 may control an erase voltage applied to the bit lines BL. According to an example embodiment, the erase control circuit 160 may generate a plurality of groups including at least two bit lines of the bit lines BL each. For example, a same erase voltage may be applied to bit lines included in one group during an erase operation. The groups may be generated based on, for example, a plurality of transistors electrically connected to the bit lines BL, respectively.

Also, according to an example embodiment, the erase control circuit 160 may apply different erase voltages to at least two groups from among the groups during an erase operation for the memory cell array 110. For example, the erase control circuit 160 may apply erase voltages having different levels to be applied to different groups, respectively. In another example, the erase control circuit 160 may apply erase voltages having different application times to different groups, respectively.

Figure 2:
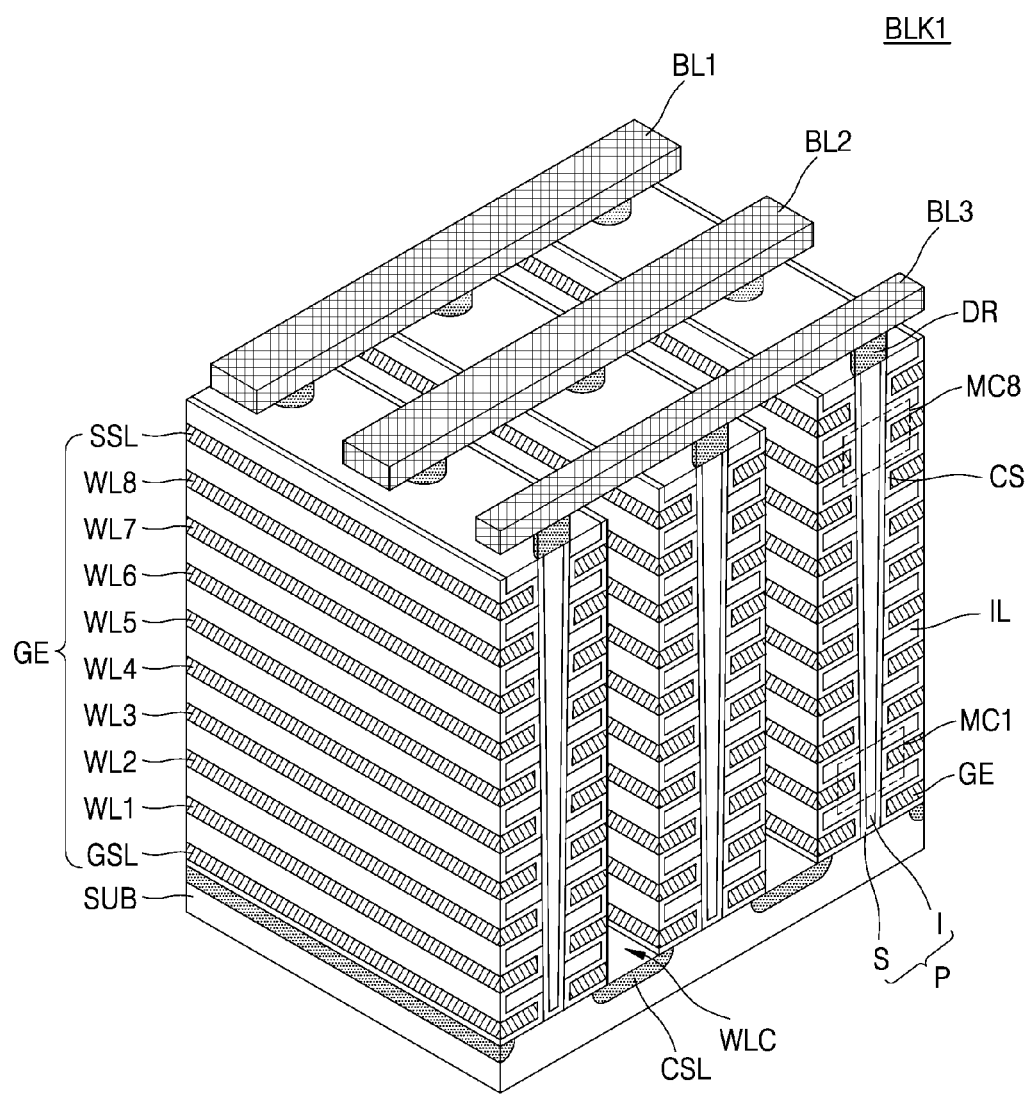
FIG. 2 is a perspective view of a three-dimensional implementation of an integrated circuit memory block containing a plurality of NAND-type strings of nonvolatile memory cells, which may be utilized as a memory block within the memory cell array of FIG. 1.
Figure 2:
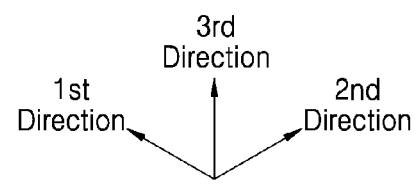

FIG. 2 is a perspective view of an implementation example of a first memory block from among memory blocks of FIG. 1. Referring to FIG. 2, a first memory block BLK1 may be formed in a direction perpendicular to a substrate SUB (e.g., a third direction). Although FIG. 2 shows that the first memory block BLK1 includes a ground select line GSL, a string select line SSL, eight word lines WL1 to WL8, and three bit lines BL1 to BL3, It is merely for convenience of explanation, and the numbers of lines may be greater than or less than these. Also, in another example, the first memory block BLK1 may include one or more dummy word lines between a first word line WL1 and the ground select line GSL and/or between an eighth word line WL8 and the string select line SSL.

The substrate SUB may be a polysilicon film doped to a first conductivity type (e.g., p-type). The substrate SUB may be a bulk silicon substrate, a silicon-on-insulator (SOI) substrate, a germanium substrate, a germanium-on-insulator (GOI) substrate, a silicon-germanium substrate, or an epitaxial thin-film substrate obtained by performing a selective epitaxial growth (SEG). The substrate SUB may include a semiconductor material. For example, the substrate SUB may include at least one of silicon (Si), germanium (Ge), silicon germanium (SiGe), gallium arsenide (GaAs), indium gallium arsenide (InGaAs), aluminum gallium arsenide (AlGaAs), or a mixture thereof.

The substrate SUB may be provided with a common source line CSL extending in a first direction on the substrate SUB and doped with impurities of a second conductivity type (e.g., n-type). A plurality of insulation layers IL extending in the first direction are sequentially provided in a third direction on a region of the substrate SUB between two common source lines CSL adjacent to each other, and the insulation layers IL may be a certain distance spaced from one another in the third direction. For example, the insulation layers IL may include an insulating material like a silicon oxide.

A plurality of pillars P arranged sequentially in the first direction on a region of the substrate SUB with the common source line CSL therebetween and penetrating through the insulation layers IL in the third direction may be provided. For example, the pillars P may contact the substrate SUB by penetrating through the insulation layers IL. In detail, a surface layer S of each pillar P may include a silicon material doped to a first conductivity type and function as a channel region. In this specification, the pillars P may also be referred to as vertical channel structures. On the other hand, an inner layer I of each pillar P may include an insulating material like silicon oxide or an air gap. For example, the size of a channel hole in each pillar P may decrease toward the substrate SUB.

A charge storage layer CS may be provided on the substrate SUB along exposed surfaces of the insulation layers IL, the pillars P, and the substrate SUB via the common source line CSL therebetween. The charge storage layer CS may include a gate insulating layer (or a 'tunneling insulating layer'), a charge trapping layer, and a blocking insulation layer. For example, the charge storage layer CS may have an oxide-nitride-oxide (ONO) structure. Also, in a region between two common source lines CSL adjacent to each other, gate electrodes GE like the ground select line GSL, the string select line SSL, and word lines WL1 to WL8 may be provided on the exposed surface of the charge storage layer CS.

Drains or drain contacts DR may be provided on the pillars P, respectively. For example, the drains or the drain contacts DR may include a silicon material doped with impurities of the second conductivity type. On the drain contacts DR, the bit lines BL1 to BL3 extending in the second direction and by a certain distance apart from one another in the first direction may be provided. The bit lines BL1 to BL3 may be electrically connected to the drain contacts DR through contact plugs (not shown).

On the common source line CSL, a word line cut region WLC extending in the first direction may be provided. The gate electrodes GE may be separated by the word line cut region WLC. For example, the word line cut region WLC may include an insulating material or may be an air gap.

Figure 3:
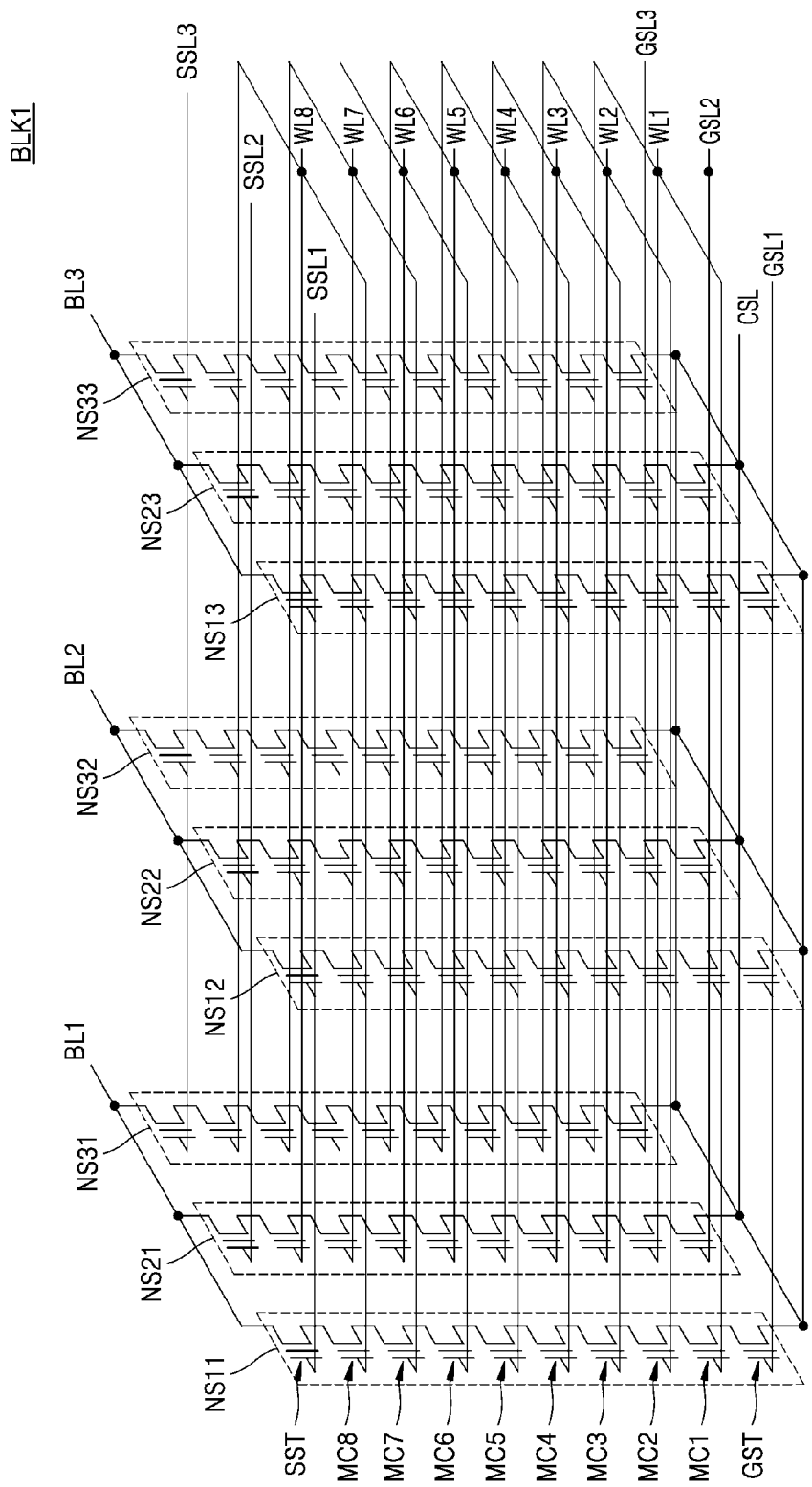
FIG. 3 is a circuit diagram showing an equivalent circuit of the memory block of FIG. 2.

FIG. 3 is a circuit diagram showing an equivalent circuit of the first memory block BLK1 from among the memory blocks of FIG. 1. Referring to FIG. 3, the first memory block BLK1 may be a vertical NAND flash memory, and each of the memory blocks BLK1 to BLKz shown in FIG. 1 may be implemented as shown in FIG. 3. The first memory block BLK1 may include a plurality of NAND cell strings NS11 to NS33, the word lines WL1 to WL8, the bit lines BL1 to BL3, a plurality of ground select lines GSL1 to GSL3, a plurality of string select lines SSL1 to SSL3, and the common source line CSL. Here, the number of NAND cell strings, the number of word lines, the number of bit lines, the number of ground select lines, and the number of string select lines may vary according to embodiments.

NAND cell strings NS11, NS21, and NS31 are provided between a first bit line BL1 and the common source line CSL, NAND cell strings NS12, NS22, and NS32 are provided between a second bit line BL2 and the common source line CSL, and NAND cell strings NS13, NS23, and NS33 are provided between a third bit line BL3 and the common source line CSL. Each NAND cell string (e.g., a NAND cell string NS11) may include a string select transistor SST, a plurality of memory cells MC1 to MC8, and a ground select transistor GST that are connected in series.

NAND cell strings connected to one bit line in common may constitute one column. For example, the NAND cell strings NS11, NS21, and NS31 connected in common to the first bit line BL1 may correspond to a first column, the NAND cell strings NS12, NS22, and NS32 connected in common to the second bit line may correspond to a second column, and the NAND cell strings NS13, NS23, and NS33 connected in common to the third bit line BL3 may correspond to a third column.

NAND cell strings connected to one cell string select line may constitute one row. For example, NAND cell strings NS11, NS12, and NS13 connected to a first string select line SSL1 may correspond to a first row, NAND cell strings NS21, NS22, and NS23 connected to a second string select line SSL2 may correspond to a second row, and NAND cell strings NS31, NS32, and NS33 connected to a third string select line SSL3 may correspond to a third row.

String select transistors SST may be connected to the corresponding string select lines SSL1 to SSL3, respectively. The memory cells MC1 to MC8 may be connected to corresponding word lines WL1 to WL8, respectively. Ground select transistors GST may be connected to the corresponding ground select lines GSL1 to GSL3, and the string select transistors SST may be connected to the corresponding bit lines BL1 to BL3. The ground select transistors GST may be connected to the common source line CSL.

In the present embodiment, word lines at the same height (for example, first word lines WL1) are commonly connected, the string select lines SSL1 to SSL3 are separated from one another, and the ground select lines GSL1 to GSL3 are also separated from one another. For example, in the case of programming memory cells in the NAND cell strings NS11, NS12, and NS13 connected to the first word line WL1 and corresponding to the first row, the first word line WL1 and the first string select line SSL1 are selected. However, the inventive concept is not limited thereto. According to other embodiments, the ground select lines GSL1 through GSL3 may be commonly connected.

Figure 4B:
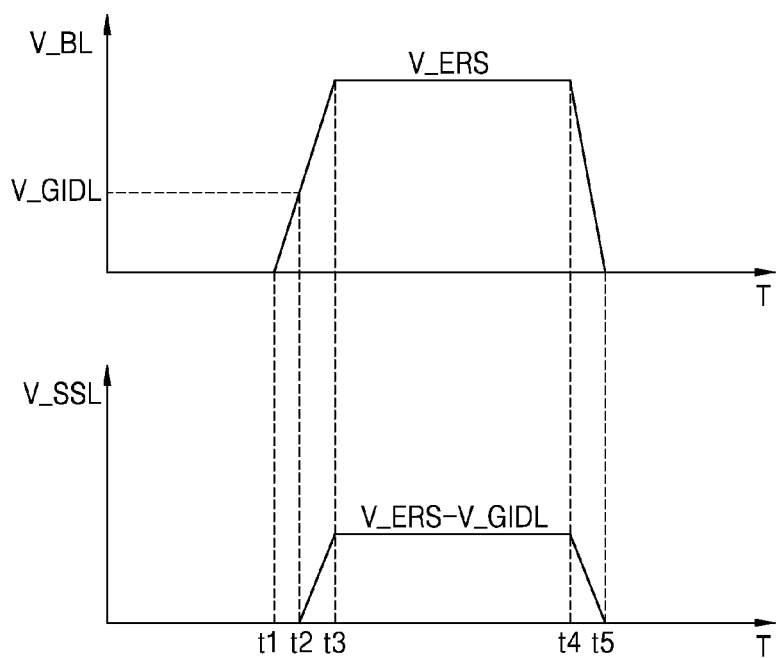

FIGS. 4A and 4B are diagrams for describing an erase operation according to an example embodiment. In detail, FIG. 4A shows an example of erase bias conditions for the first memory block BLK1 in FIG. 3, and FIG. 4B shows a graph indicating the erase bias condition of FIG. 4A. Referring to FIGS. 4A and 4B, in order to perform an erase operation on the first memory block BLK1, a bit line voltage V_BL applied to the bit lines BL may rise from a first time point t1 to a third time point t3. At a second time point t2, the bit line voltage V_BL reaches the GIDL voltage V_GIDL, and a string select line voltage V_SSL may also rise. The string select line voltage V_SSL may rise from the second time point t2 to the third time point t3. The bit line voltage V_BL may reach an erase voltage V_ERS at the third time point t3, and the string select line voltage V_SSL may reach a bias voltage Vbias at the third time point t3. The bias voltage Vbias may have the same level as a value obtained by subtracting the GIDL voltage V_GIDL from the erase voltage V_ERS, for example.

The bit line voltage V_BL may then maintain the erase voltage V_ERS from the third time point t3 to a fourth time point t4. For example, the time interval from the third time point t3 to the fourth time point t4 where the erase voltage V_ERS is maintained may be referred to as an application time of the erase voltage V_ERS. Hereinafter, the application time may refer to a period of time during which a target voltage is maintained and applied.

According to an example embodiment, erase voltages having different levels may be applied to bit lines of a first group and bit lines of a second group from among groups generated in the erase control circuit 160 from the third time point t3 to the fourth time point t4. For example, vertical channel structures electrically connected to the bit lines included in the first group may be placed closer to the word line cut region WLC than vertical channel structures electrically connected to the bit lines included in the second group. In this case, the level of the erase voltage applied to the bit lines of the first group may be lower than the level of the erase voltage applied to the bit lines of the second group.

Subsequently, the bit line voltage V_BL may drop to the initial voltage of the first time point t1 at the fourth time point t4. According to an example embodiment, when the erase voltage applied to the bit lines of the second group from among the groups generated in the erase control circuit 160 drops at the fourth time point t4, the erase voltage applied to the bit lines of the first group may drop before the fourth time point t4. In other words, the application time (or maintenance time) of the erase voltage with respect to the bit lines of the first group may be shorter than the application time (or maintenance time) of the erase voltage with respect to the bit lines of the second group.

Holes are generated at drain edges of the string select transistors SST as a voltage equal to or higher than the GIDL voltage V_GIDL is applied as the bit line voltage V_BL, and thus channels are charged from terminal ends of the bit lines BL of the NAND strings NS11 to NS33. The channels are continuously charged from terminal ends of the bit lines BL until the bit line voltage V_BL rises to the erase voltage V_ERS. On the other hand, the string select line voltage V_SSL may drop to the initial voltage of the second time point t2 at the fourth time point t4.

From the second time point t2 to the third time point t3, electron-hole pairs may be generated near connected portions of the bit lines BL. Electrons may concentrate at the terminal ends of the bit line BL to which a high voltage is applied, and the holes may drift to the channel and charge the channel. Therefore, the channel may be boosted close to the GIDL voltage V_GIDL. From the third time point t3 to the fourth time point t4, the bit line voltage V_BL may maintain the erase voltage V_ERS, and the string select line voltage V_SSL may maintain the bias voltage Vbias (e.g., a value obtained by subtracting the GIDL voltage V_GIDL from the erase voltage V_ERS). At this time, electron-hole pairs are continuously generated, and the channel may be charged to a higher potential.

Also, a voltage V_WL applied to the word lines WL may be a word line erase voltage Vwe and may be, for example, 0 V. At this time, both the ground select lines GSL and the common source line CSL may be floated. As described above, an erase operation may be performed on the first memory block BLK1 based on a GIDL phenomenon caused by a voltage applied to the bit lines BL.

Figure 5A:
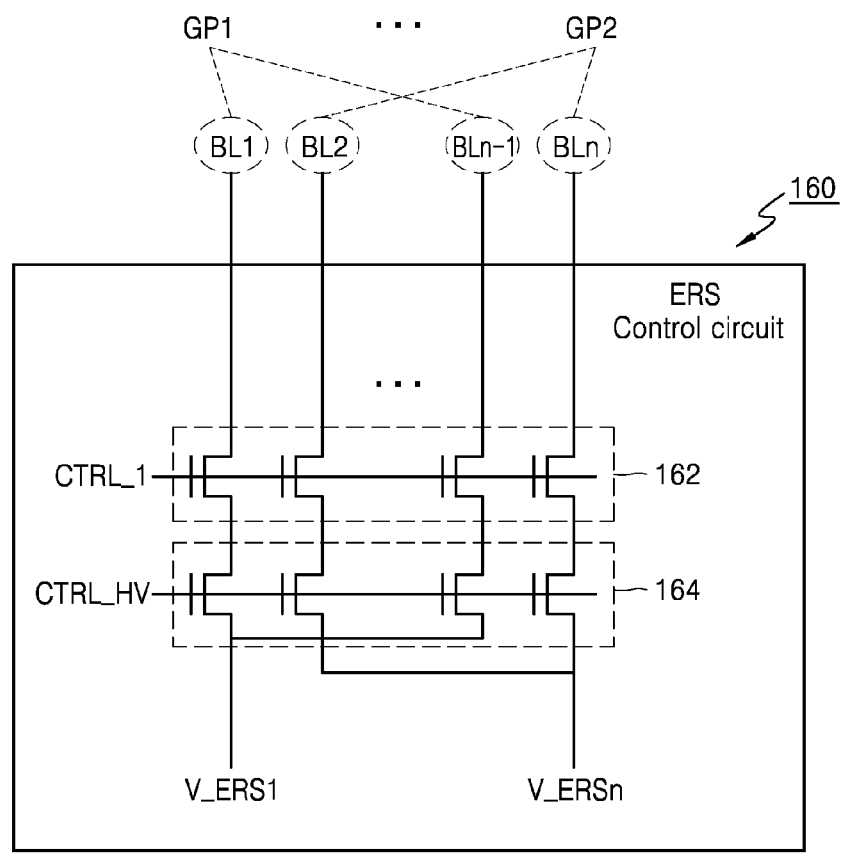
FIG. 5A is an electrical schematic of a portion of an erase control circuit according to an embodiment of the invention.
Figure 5B:
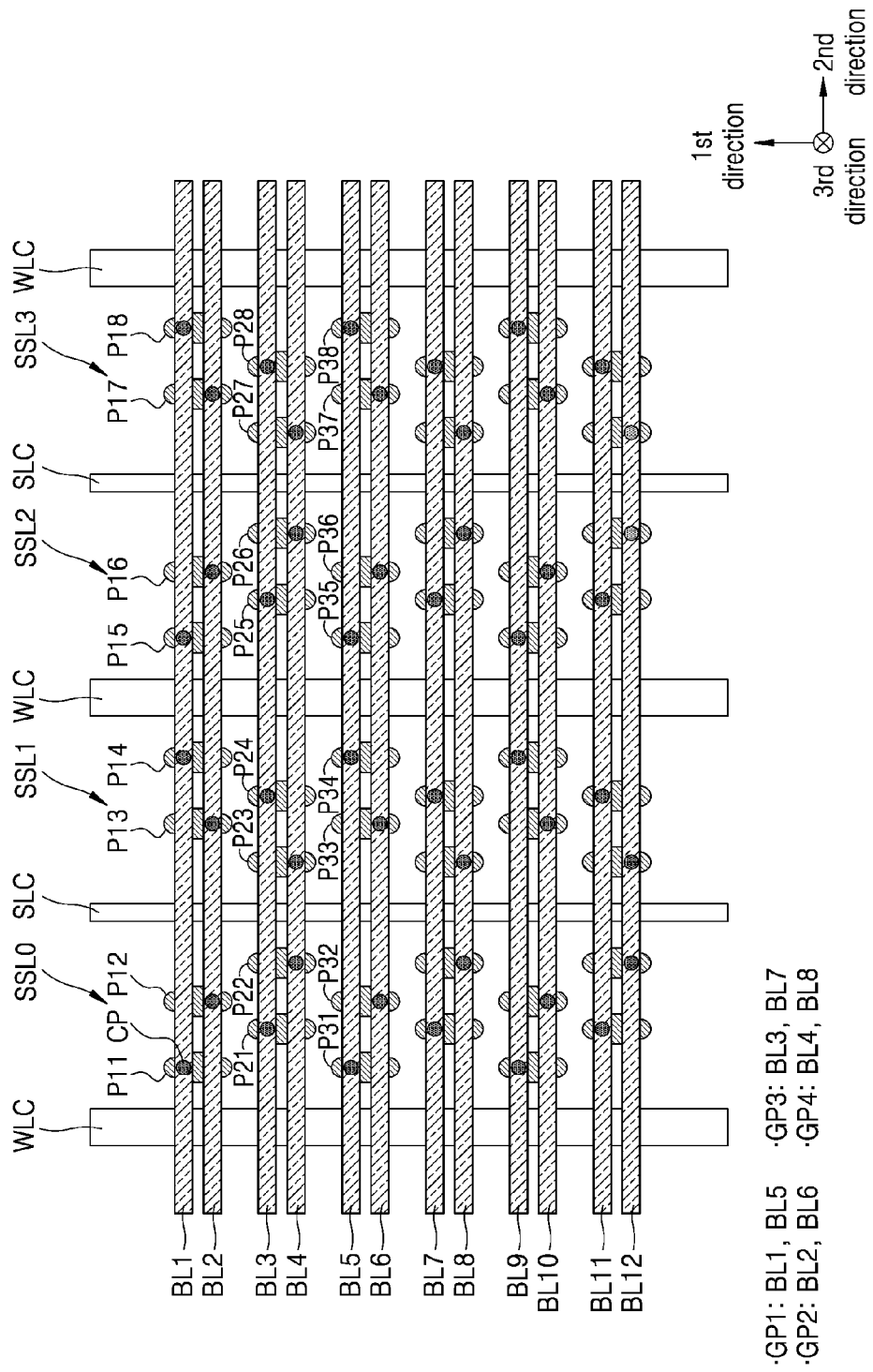
FIG. 5B is a plan view of an embodiment of the memory cell array of FIG. 1 that illustrates placement of bit lines and memory cell groups according to an embodiment of the invention.

FIGS. 5A and 5B are diagrams for describing groups for bit lines formed according to an example embodiment. In detail, FIG. 5A shows a specific configuration of the erase control circuit 160 connected to bit lines, and FIG. 5B is a top view of some components of the memory block (e.g., the first memory block BLK1 in FIG. 2). Referring now to FIG. 5A, the erase control circuit 160 may include a plurality of first transistors 162 and a plurality of second transistors 164. The first transistors 162 are respectively electrically connected between the bit lines BL1 to BLn and the second transistors 164 and may receive a control signal CTRL_1. For example, the control signal CTRL_1 may be output from the control logic 120 and the first transistors 162 may be turned on or off based on the control signal CTRL_1. Although FIGS. 5A and 5B show that all of the first transistors 162 receive the same control signal CTRL_1, the inventive concept is not limited thereto. That is, different control signals CTRL_1 may be applied to the first transistors 162.

Each of the second transistors 164 may include a first terminal to which an erase voltage control signal CTRL_HV is applied and a second terminal electrically connected to the bit lines BL1 to BLn through the first transistors 162. For example, the first terminal may be a gate terminal and the second terminal may be a drain (or source) terminal. Although FIGS. 5A and 5B show that the same erase voltage control signal CTRL_HV is applied to the first terminals of the second transistors 164, the inventive concept is not limited thereto. That is, different erase voltage control signals CTRL_HV may be applied to the first terminals of the second transistors 164.

In an example embodiment, at least two of third terminals of the second transistors 164 may be electrically connected to each other, and an erase voltage may be applied thereto. For example, a third terminal of each of the second transistors 164 electrically connected to the first bit line BL1 and an n−1-th bit line BLn−1 may be electrically connected each other, and a first erase voltage V_ERS1 may be applied thereto. Also, a third terminal of each of the second transistors 164 electrically connected to the second bit line BL2 and an n-th bit line BLn may be electrically connected each other and an n-th erase voltage V_ERSn may be applied thereto. In other words, in an erase operation, the first bit line BL1 and the n−1-th bit line BLn−1 may form a first group GP1, and the second bit line BL2 and the n-th bit line BLn may form a second group GP2.

In an example embodiment, the first erase voltage V_ERS1 and the n-th erase voltage V_ERSn may have different levels. In another example embodiment, the first erase voltage V_ERS1 and the n-th erase voltage V_ERSn may have different application times (e.g., different durations relative to each other). In another example embodiment, the first erase voltage V_ERS1 and the n-th erase voltage V_ERSn have a same voltage level (e.g., magnitude), but a turn-on time of the second transistors 164 to which the first erase voltage V_ERS1 is applied may be different from a turn-on time of the second transistors 164 to which the n-th erase voltage V_ERSn is applied.

Referring to FIG. 5B, the first memory block BLK1 may include word line cut regions WLC extending in the first direction and apart from each other in a second direction and select line cut regions SLC between two word line cut regions WLC. For example, a select line cut region SLC is a region on the eighth word line WL8, and the string select line SSL may be separated by the select line cut region SLC. For example, the select line cut region SLC may include an insulating material or may be an air gap.

Due to the select line cut regions SLC, a plurality of string select line regions SSL0 to SSL3 may be distinguished from one another. For example, the string select line regions SSL0 to SSL3 may include string select lines different from one another and may be selected based on the string select lines different from one another.

The first memory block BLK1 may include a plurality of pillars P11 to P38 arranged in the first and second directions between the word line cut region WLC and the select line cut region SLC. Bit lines BL1 to BL12 may be arranged in the first direction over the first memory block BLK1, and each of the pillars P11 to P38 may be electrically connected to one bit line through a contact plug CP.

For example, the first bit line BL1 may be electrically connected to pillars P11, P14, P15, and P18. The second bit line BL2 may be electrically connected to pillars P12, P13, P16, and P17. The third bit line BL3 may be electrically connected to pillars P21, P24, P25, and P28. A fourth bit line BL4 may be electrically connected to pillars P22, P23, P26, and P27. In the same pattern, electrical connections may be established between fifth to twelfth bit lines B5 to B12 and pillars.

In an example embodiment, the first bit line BL1 and a fifth bit line BL5 may constitute the first group GP1. Furthermore, the second bit line BL2 and a sixth bit line BL6 may constitute the second group GP2. Furthermore, the third bit line BL3 and a seventh bit line BL7 may constitute a third group GP3. Furthermore, the fourth bit line BL4 and an eighth bit line BL8 may constitute a fourth group GP4.

Therefore, pillars electrically connected to the first bit line BL1 and the fifth bit line BL5 included in the first group GP1 may be located closer to the word line cut region WLC than pillars electrically connected to the third bit line BL3 and the seventh bit line BL7 included in the third group GP3. Also, pillars electrically connected to the third bit line BL3 and the seventh bit line BL7 included in the third group GP3 may be located closer to the word line cut region WLC than pillars electrically connected to the second bit line BL2 and the sixth bit line BL6 included in the second group GP2. Also, pillars electrically connected to the second bit line BL2 and the sixth bit line BL6 included in the second group GP2 may be located closer to the word line cut region WLC than pillars electrically connected to the fourth bit line BL4 and the eighth bit line BL8 included in the fourth group GP4.

In the present embodiment, it is described that two bit lines constitute one group. However, it is merely an example, and the inventive concept is not limited thereto. That is, the first bit line BL1, the fifth bit line BL5, and a ninth bit line BL9 may constitute the first group GP1. Also, the second bit line BL2, the sixth bit line BL6, and a tenth bit line BL10 may constitute the second group GP2. Alternatively, the first group GP1 and the second group GP2 may each include a greater number of bit lines.

Due to process characteristics, vertical channel structures (or the pillars P) may be channel holes with different sizes depending on distances from the word line cut region WLC. For example, in an erase operation, when a same erase voltage is applied to the vertical channel structures having channel holes with different sizes, threshold voltage distributions of memory cells in the respective vertical channel structures differ from one another, thereby jeopardizing the reliability of data. In a memory device according to the inventive concept, a plurality of groups may be provided for bit lines, and an erase control circuit for applying different erase voltages to the respective groups in an erase operation may be provided. Therefore, for example, different erase voltages may be applied to the vertical structures having channel holes with different sizes, and thus differences between threshold voltage distributions of the memory cells in the respective vertical channel structures may be reduced. Therefore, the reliability of data stored in the memory device may be improved.

Figure 6:
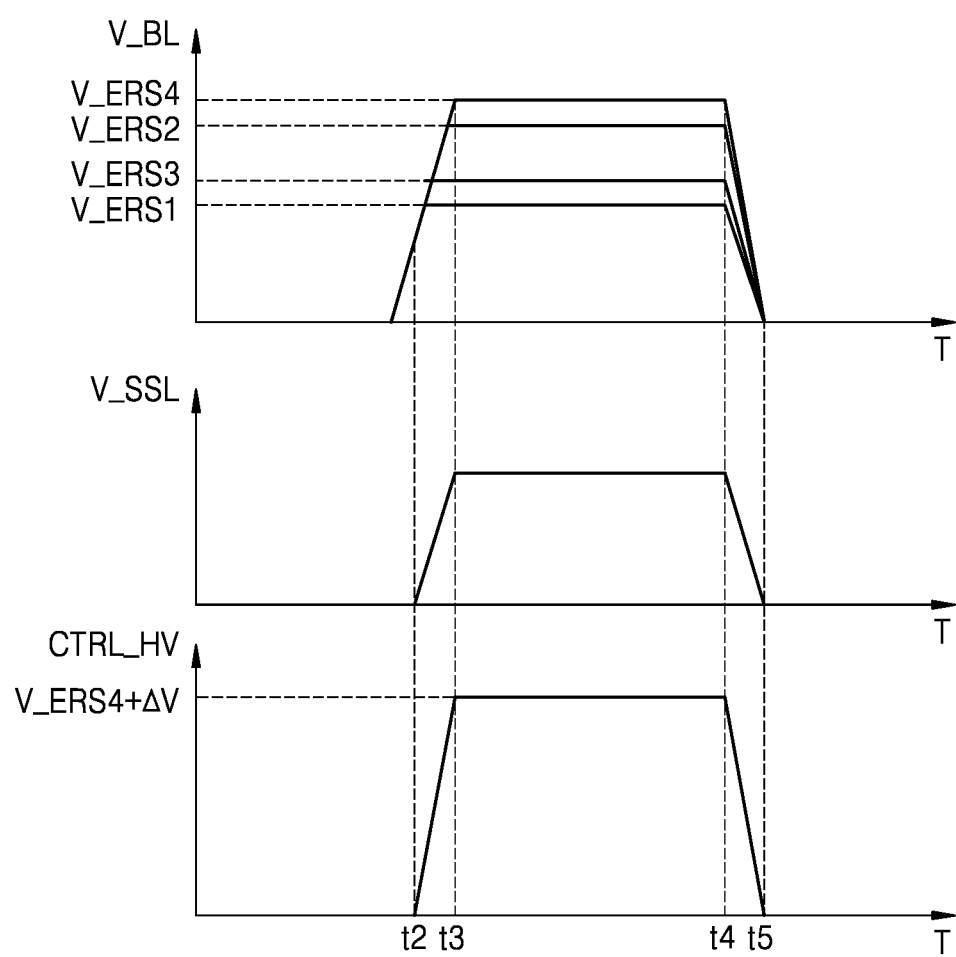
FIG. 6 is a timing diagram showing voltages applied to bit lines included in each of a plurality of memory cell groups during an erase operation, according to an embodiment of the invention.

FIG. 6 is a graph showing voltages applied to bit lines included in each group according to an example embodiment. FIG. 6 may be a graph showing voltages applied to bit lines BL1 to BL12 shown in FIG. 5B, for example. Referring to FIG. 6, at the second time point t2, the erase voltage control signal CTRL_HV applied to the second transistors 164 may be activated. In other words, the erase voltage control signal CTRL_HV may turn the second transistors 164 on. In this graph, the level of the erase voltage control signal CTRL_HV is shown as a sum of a fourth erase voltage V_ERS4 and a gate voltage (e.g., a gate-source voltage of the second transistor 164), but is not limited thereto. Accordingly, erase voltages may be applied to bit lines included in the first group GP1, the second group GP2, the third group GP3, and the fourth group GP4 at the second time point t2. In an example embodiment, the first erase voltage V_ERS1 may be applied to the first bit line BL1 and the fifth bit line BL5 included in the first group GP1 until the fourth time point t4. Furthermore, a second erase voltage V_ERS2 may be applied to the second bit line BL2 and the sixth bit line BL6 included in the second group GP2 until the fourth time point t4. Furthermore, a third erase voltage V_ERS3 may be applied to the third bit line BL3 and the seventh bit line BL7 included in the third group GP3 until the fourth time point t4. Furthermore, a fourth erase voltage V_ERS4 may be applied to the fourth bit line BL4 and the eighth bit line BL8 included in the fourth group GP4 until the fourth time point t4.

In an example embodiment, the third erase voltage V_ERS3 may have a level higher than that of the first erase voltage V_ERS1 and may have a level lower than that of the second erase voltage V_ERS2. Furthermore, the second erase voltage V_ERS2 may have a level lower than that of the fourth erase voltage V_ERS4. Therefore, in an erase operation, relatively low erase voltages may be applied to pillars (e.g., P11, P14, etc.) that are relatively close to the word line cut region WLC and relatively high erase voltages may be applied to pillars (e.g., P22, P23, etc.) that are relatively far from the word line cut region WLC.

Figure 7A:
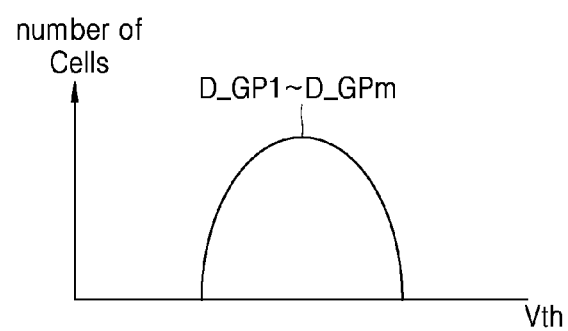
FIG. 7A is a diagram showing a threshold voltage distribution after an erase operation of memory cells included in groups formed according to an example embodiment.
Figure 7B:
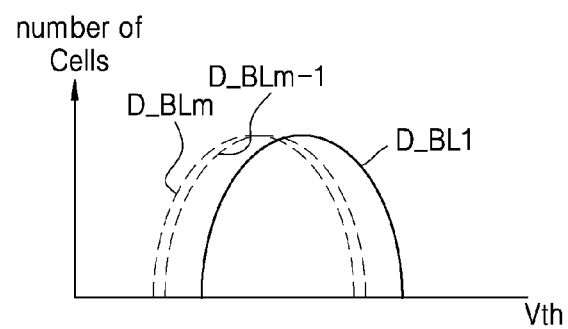
FIG. 7B is a diagram showing a threshold voltage distribution after an erase operation of memory cells connected to a bit line according to a comparative embodiment.

FIG. 7A is a diagram showing a threshold voltage distribution after an erase operation is performed on memory cells included in groups formed according to an example embodiment, whereas FIG. 7B is a diagram showing a threshold voltage distribution after an erase operation of memory cells connected to a bit line according to a comparative example. Referring to FIG. 7A, threshold voltage distributions D_GP1 to D_GPm (m is a natural number) of memory cells electrically connected to bit lines included in groups (e.g., the first group GP1, the second group GP2, the third group GP3, and the fourth group GP4 of FIG. 5B) formed according to the present embodiment may be approximately (or substantially) identical to one another. For example, sizes of channel holes may vary according to distances from the word line cut region WLC due to a process for forming a gate conductive layer that constitutes a memory block. Referring to FIG. 7B, when the erase control circuit 160 according to the inventive concept is omitted, there may be a skew between the threshold voltage distributions D_BL1 to DBLm according to bit lines after an erase operation of memory cells. In a memory device provided with the erase control circuit 160 according to the inventive concept, since applied erase voltages vary depending on groups formed based on distances from the word line cut region WLC, the skew between threshold voltage distributions of memory cells after an erase operation may be enhanced.

Figure 8:
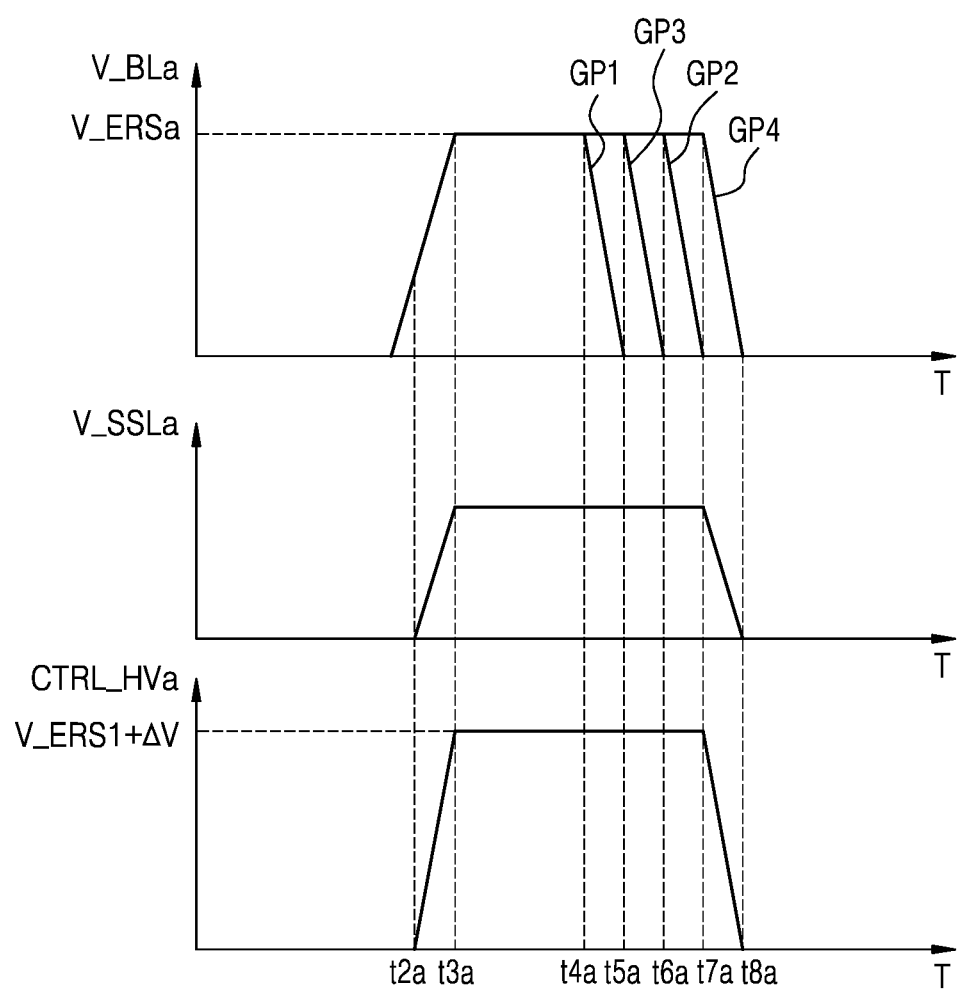
FIG. 8 is a timing diagram showing voltages applied to bit lines included in each group according to another example embodiment of the invention.

FIG. 8 is a graph showing voltages applied to bit lines included in each group according to another example embodiment. FIG. 8 may be a graph showing voltages applied to bit lines BL1 to BL12 shown in FIG. 5B, for example. Referring to FIG. 8, at a second time point t2a, an erase voltage V_ERSa may be applied to bit lines included in the first group GP1, the second group GP2, the third group GP3, and the fourth group GP4. In the example embodiment, the erase voltage V_ERSa having application times (or holding times) different from one another may be applied to the first group GP1, the second group GP2, the third group GP3, and the fourth group GP4, respectively.

For example, the erase voltage V_ERSa may be applied to the first bit line BL1 and the fifth bit line BL5 included in the first group GP1 until a fourth time point t4a. Furthermore, the erase voltage V_ERSa may be applied to the third bit line BL3 and the seventh bit line BL7 included in the third group GP3 until a fifth time point t5a. Furthermore, the erase voltage V_ERSa may be applied to the second bit line BL2 and the sixth bit line BL6 included in the second group GP2 until a sixth time point t6a. Furthermore, the erase voltage V_ERSa may be applied to the fourth bit line BL4 and the eighth bit line BL8 included in the fourth group GP4 until a seventh time point t7a.

In an example embodiment, a plurality of erase voltages having different application times (e.g., unequal durations of application during an erase operation) from one another may be generated by the voltage generator 130. Also, the erase control circuit 160 may control each of the erase voltages having different application times from one another to be applied to respective groups.

Figure 9:
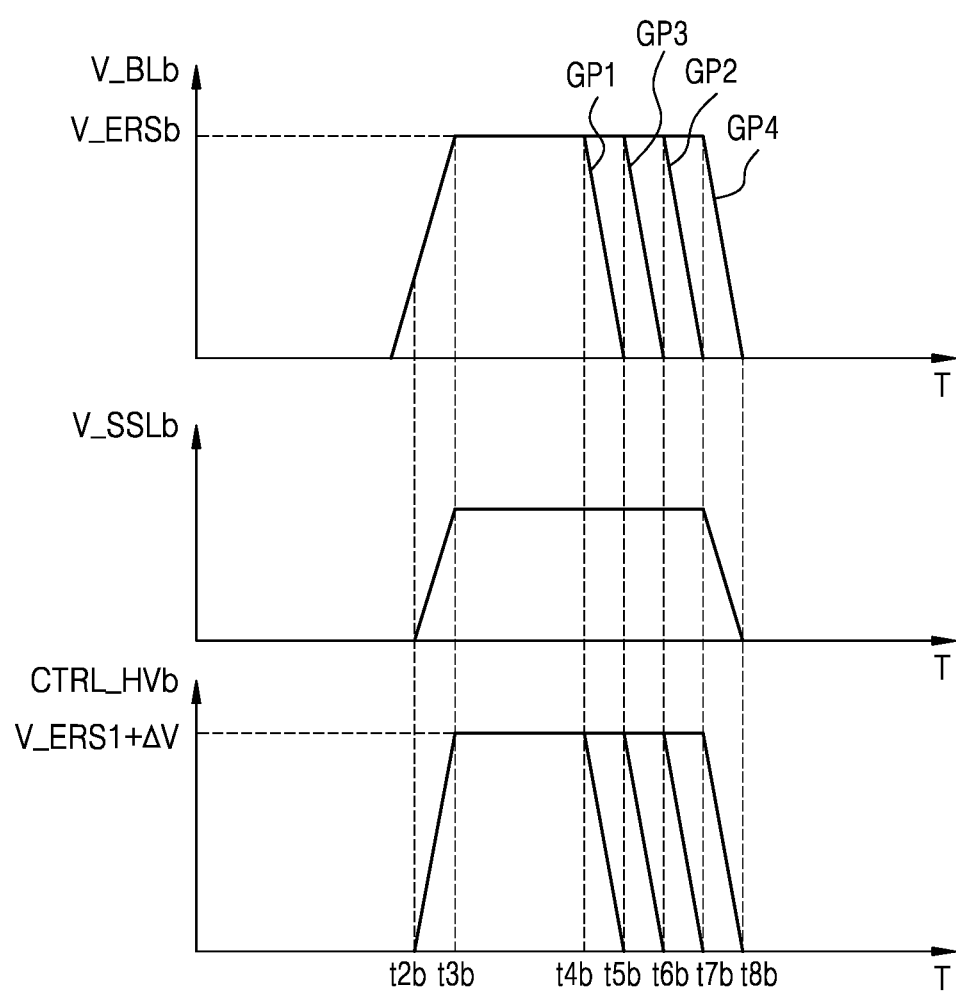
FIG. 9 is a timing diagram showing voltages applied to bit lines included in each group according to another example embodiment of the invention.

FIG. 9 is a graph showing voltages applied to bit lines included in each group according to another example embodiment. The graph of FIG. 9 may be similar to the graph of FIG. 8. However, unlike in FIG. 8, in FIG. 9, the erase voltage control signal CTRL_HV may be applied to the second transistors 164 at different application times, respectively.

For example, the erase voltage control signal CTRL_HV may be applied to a second transistor included in the first group GP1 until a fourth time t4b. Furthermore, the erase voltage control signal CTRL_HV may be applied to a second transistor included in the third group GP3 until a fifth time t5b. Furthermore, the erase voltage control signal CTRL_HV may be applied to a second transistor included in the second group GP2 until a sixth time t6b. Furthermore, the erase voltage control signal CTRL_HV may be applied to a second transistor included in the fourth group GP4 until a seventh time t7b.

In other words, the erase control circuit 160 may apply erase voltages having different application times from one another to the respective groups (e.g., the first group GP1, the second group GP2, the third group GP3, and the fourth group GP4) based on the operation of the second transistors 164. For example, the erase control circuit 160 may control the turn-on time of each of the second transistors 164 that have received the erase voltage V_ERSb generated by the voltage generator 130, thereby applying different erase voltages to be applied to the respective groups.

Figure 10A:
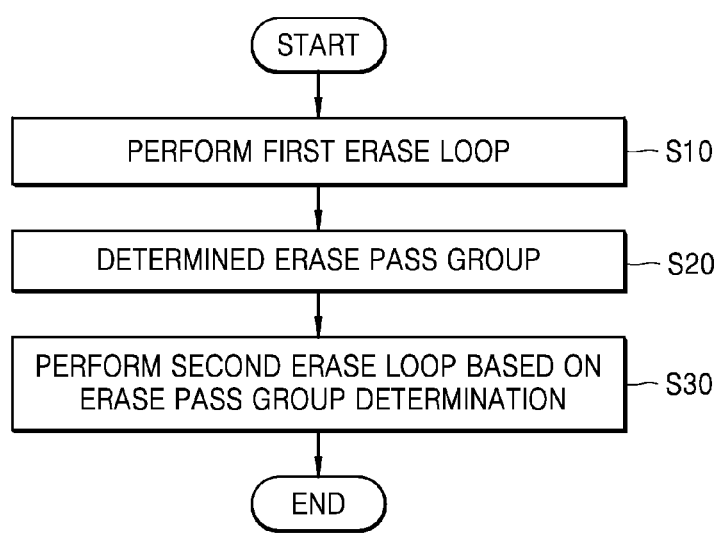
FIG. 10A is a flow diagram of operations that illustrates multi-loop erase operations according to an embodiment of the invention.
Figure 10B:
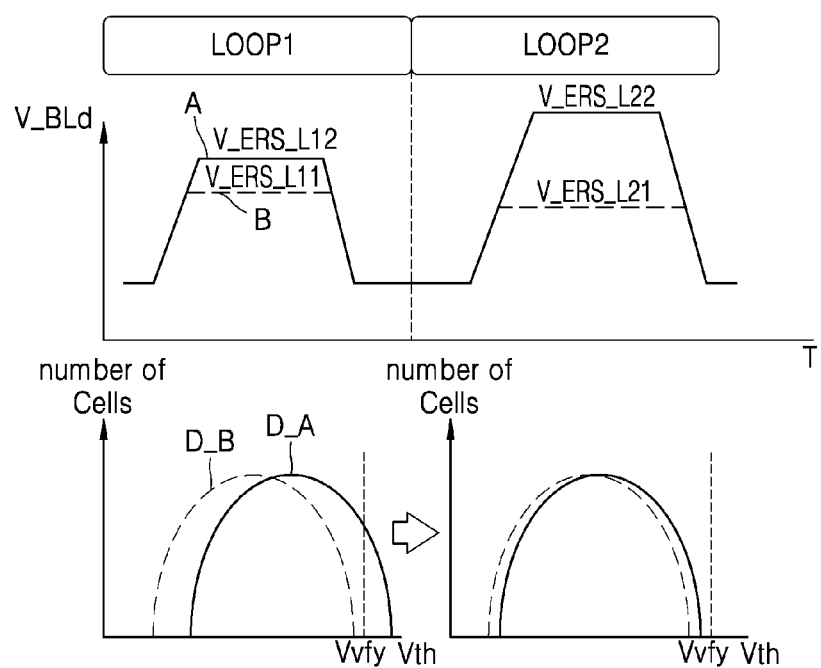
FIGS. 10B-10C are timing and threshold voltage diagrams that illustrate multi-loop erase operations according to an embodiment of the invention.
Figure 10C:
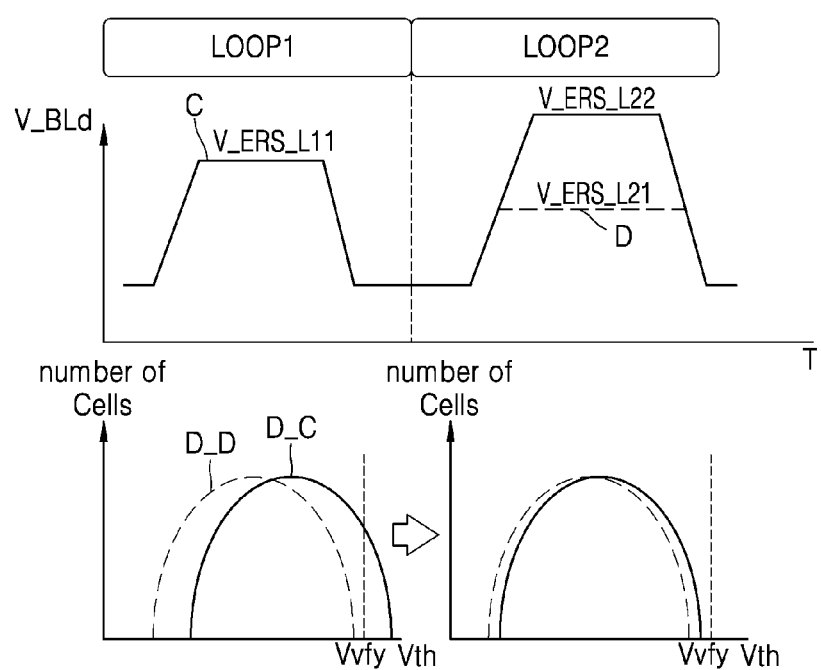

FIGS. 10A to 10C are diagrams for describing an erase operation performed through a plurality of consecutive loops according to an example embodiment. In detail, FIG. 10A is a flowchart of an erase operation, and FIGS. 10B and 10C are examples of erase voltages for respective loops during an erase operation and threshold voltage distributions based on the same. FIGS. 10A to 10C will be described below with reference to FIG. 5B.

Referring to FIGS. 10A and 10B, a first erase loop LOOP1 for memory cells may be performed first (operation S10). In the first erase loop LOOP1, a first loop erase voltage may be applied to each bit line. In an example embodiment, different first loop erase voltages may be applied to the first bit line BL1 and the fifth bit line BL5 included in the first group GP1 and the second bit line BL2 and the sixth bit line BL6 included in the second group GP2. The erase voltages applied to the first bit line BL1 and the fifth bit line BL5 included in the first group GP1 are shown as graph B, and the erase voltages applied to the second bit line BL2 and the sixth bit line BL6 included in the second group GP2 are shown as graph A.

For example, a first loop erase voltage V_ERS_L11 applied to the first bit line BL1 and the fifth bit line BL5 included in the first group GP1 may have a level lower than that of a first loop erase voltage V_ERS_L12 applied to the second bit line BL2 and the sixth bit line BL6 included in the second group GP2. When the first erase loop LOOP1 is completed, a threshold voltage distribution D_B of memory cells connected to the first bit line BL1 and the fifth bit line BL5 included in the first group GP1 and a threshold voltage distribution D_A of memory cells connected to the second bit line BL2 and the sixth bit line BL6 included in the second group GP2 may be formed.

Next, a determination on an erase pass group may be performed (operation S20). For example, the threshold voltage distribution D_B of the memory cells connected to the first bit line BL1 and the fifth bit line BL5 included in the first group GP1 may be formed at a level lower than a verify voltage Vvfy according to the first erase loop LOOP1, and thus the first group GP1 may be determined as an erase pass group. On the other hand, the threshold voltage distribution D_A of the memory cells connected to the second bit line BL2 and the sixth bit line BL6 included in the second group GP2 may be at least partially formed at a level higher than the verify voltage Vvfy according to the first erase loop LOOP1, and thus the second group GP2 may not be determined as an erase pass group.

Next, a second erase loop LOOP2 may be performed based on the determination of the erase pass group (operation S30). In an example embodiment, an erase voltage of a level lower than an erase voltage applied to the other groups may be applied to bit lines connected to a group determined as an erase pass group. For example, in the second erase loop LOOP2, a second loop erase voltage V_ERS_L21 applied to the first bit line BL1 and the fifth bit line BL5 connected to the first group GP1 may have a level lower than that of a second loop erase voltage V_ERS_L22 applied to the second bit line BL2 and the sixth bit line BL6 included in the second group GP2. Also, in an example embodiment, the second loop erase voltage V_ERS_L21 may have a level lower than or equal to that of the first loop erase voltage V_ERS_L11. Therefore, deep-erase of erase-passed memory cells connected to the first group GP1 may be prevented. Also, a skew between distributions of memory cells connected to the first group GP1 and the second group GP2 may be enhanced.

In this embodiment, although it is described that an erase operation is performed through a first erase loop LOOP1 and a second erase loop LOOP2, it is merely for convenience of explanation, and an erase operation may be performed through a greater number of erase loops. Such an erase operation performed through a plurality of erase loops as described above may be referred to as an incremental step pulse erase (ISPE).

Referring to FIG. 10C, unlike in FIG. 10B, the first loop erase voltage V_ERS_L11 of a same level may be applied to the first group GP1 and the second group GP2 in the first erase loop LOOP1. For example, an erase voltage applied to the first group GP1 may be indicated as graph D, whereas an erase voltage applied on the second group GP2 may be indicated as graph C.

In other words, in the first erase loop LOOP1, the same first loop erase voltage V_ERS_L11 is applied to the first group GP1 and the second group GP2, and it may be determined whether to pass erase for each group. For example, a threshold voltage distribution D_D of memory cells connected to the first bit line BL1 and the fifth bit line BL5 included in the first group GP1 may be formed at a level lower than the verify voltage Vvfy according to the first erase loop LOOP1, and thus the first group GP1 may be determined as an erase pass group. On the other hand, the threshold voltage distribution D_C of the memory cells connected to the second bit line BL2 and the sixth bit line BL6 included in the second group GP2 may be at least partially formed at a level higher than the verify voltage Vvfy according to the first erase loop LOOP1, and thus the second group GP2 may not be determined as an erase pass group. Next, the second erase loop LOOP2 may be performed based on the determination of the erase pass group, and an erase voltage of a level lower than that of an erase voltage applied to bit lines of the second group GP2 may be applied to bit lines of the first group GP1.

Figure 11:
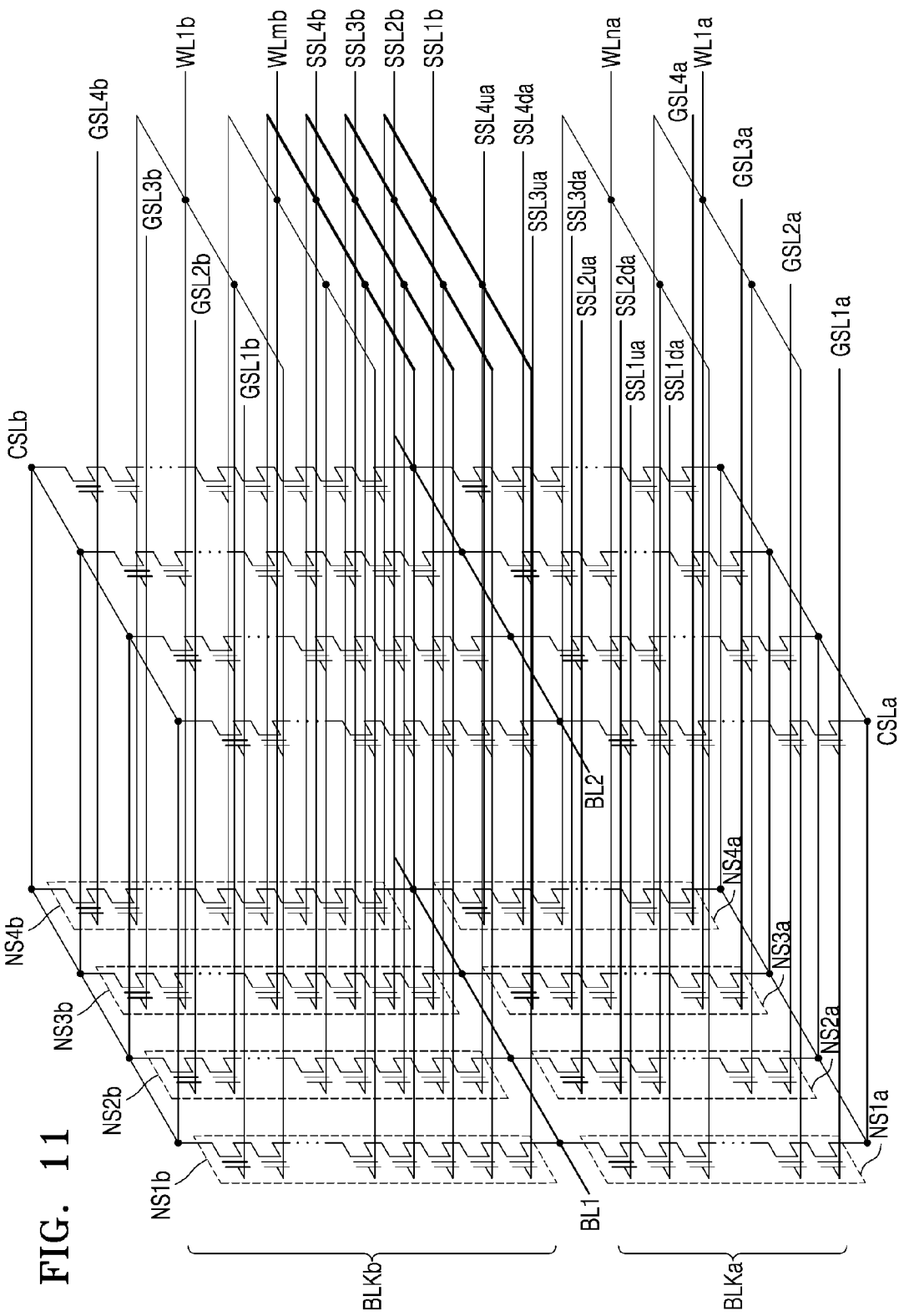
FIG. 11 is a circuit diagram showing memory blocks according to another example embodiment of the invention.

FIG. 11 is a circuit diagram showing memory blocks according to another example embodiment. Referring to FIG. 11, a first memory block BLKa and a second memory block BLKb may be memory blocks that are vertically arranged. The first memory block BLKa may include a plurality of lower NAND strings including NAND strings NS1a to NS4a, word lines WL1a to WLna, first to fourth ground select lines GSL1a to GSL4a, first to fourth lower string select lines SSL1da to SSL4da, first to fourth upper string select lines SSL1ua to SSL4ua, and a common source line CSLa. Here, n may be any natural number and may vary according to embodiments. In an example embodiment, the first to fourth ground select lines GSL1a to GSL4a may be formed in a linear shape. In an example embodiment, the first to fourth ground select lines GSL1a to GSL4a may be formed in a plate-like shape.

In some embodiments, in the first memory block BLKa, the first to fourth ground select lines GSL1a to GSL4a arranged at a same level may be electrically connected to one another. Also, in some embodiments, the first memory block BLKa may include one of the first to fourth upper string select lines SSL1ua to SSL4ua or the first to fourth lower string select lines SSL1da to SSL4da. Also, in some embodiments, the first memory blocks BLKa may further include at least one dummy word line below the first to fourth lower string select lines SSL1da to SSL4da.

A second memory block BLKb may include a plurality of upper NAND strings including NAND strings NS1b to NS4b, word lines WL1b to WLmb, first to fourth ground select lines GSL1b to GSL4b, first to fourth string select lines SSL1b to SSL4b, and a common source line CSLb. Here, m may be any natural number and may vary according to embodiments. In an example embodiment, the first to fourth ground select lines GSL1b to GSL4b may be formed in a linear shape. In an example embodiment, the first to fourth ground select lines GSL1b to GSL4b may be formed in a plate-like shape.

In an example embodiment, m may be smaller than n, and thus, the second memory block BLKb may include a smaller number of word lines than the first memory block BLKa. However, the inventive concept is not limited thereto. In some embodiments, m may be equal to n, and thus, the first memory block BLKa and the second memory block BLKb may include a same number of word lines. In some embodiments, in the second memory block BLKb, the first to fourth ground select lines GSL1b to GSL4b arranged at a same level may be electrically connected to one another. Also, in some embodiments, the second memory blocks BLKb may further include at least one dummy word line below the first to fourth string select lines SSL1b to SSL4b.

The lower NAND strings included in the first memory block BLKa may be connected to the first bit line BL1 and the second bit line BL2, and the upper NAND strings included in the second memory block BLKb may also be connected to the first bit line BL1 and the second bit line BL2. Therefore, the first memory block BLKa and the second memory block BLKb may share the first bit line BL1 and the second bit line BL2. In detail, both ends of a NAND string NS1a may be connected to the first bit line BL1 and the common source line CSLa, respectively, and both ends of a NAND string NS1b may be connected to the common source line CSLb and the first bit line BL1, respectively.

In an erase operation, erase voltages may be applied to both the first memory block BLKa and the second memory block BLKb via the first bit line BL1 and the second bit line BL2. According to an example embodiment, groups may be formed between bit lines in an erase control circuit (e.g., the erase control circuit 160 in FIG. 1), and different erase voltages may be applied to the respective groups.

Figure 12:
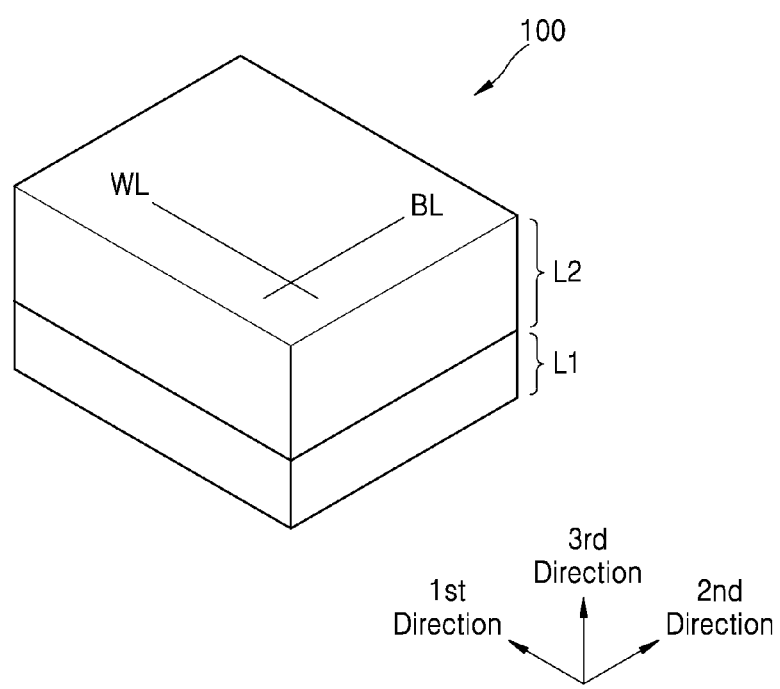
FIG. 12 is a diagram schematically showing the orthogonal orientation of word lines (WL) and bit lines (BL) on a memory device, according to an embodiment of the invention.

FIG. 12 is a diagram schematically showing the structure of a memory device according to another example embodiment. FIG. 12 may show an example of the structure of the memory device 100 of FIG. 1, for example. Hereinafter, FIG. 12 will be described with reference to FIG. 1. Referring to FIG. 12, the memory device 100 may include a first semiconductor layer L1 and a second semiconductor layer L2. The second semiconductor layer L2 may be stacked on the first semiconductor layer L1 in the third direction. In an example embodiment, at least one of the control logic 120, the voltage generator 130, the row decoder 140, the page buffer 150, and the erase control circuit 160 may be in the first semiconductor layer LI, and the memory cell array 110 may be in the second semiconductor layer L2. For example, the first semiconductor layer L1 may include a lower substrate, and the first semiconductor layer L1 may be provided with various circuits by forming semiconductor devices like transistors and patterns for wiring the semiconductor devices on the lower substrate.

After circuits are formed in the first semiconductor layer L1, the second semiconductor layer L2 including the memory cell array 110 may be formed. For example, the second semiconductor layer L2 may include substrates and, by forming a plurality of gate conductive layers stacked on the substrates and a plurality of pillars extending in a direction perpendicular to the top surfaces of the substrates (e.g., the third direction) through the gate conductive layers, the memory cell array 110 may be formed in the second semiconductor layer L2. Also, patterns for electrically connecting the memory cell array 110 (i.e., the word lines WL and the bit lines BL) and circuits formed in the first semiconductor layer LI may be formed in the second semiconductor layer L2. For example, the word lines WL may extend in the first direction and be arranged in the second direction. Also, the bit lines BL may extend in the second direction and be arranged in the first direction.

Accordingly, the memory device 100 may have a structure in which the control logic 120, the row decoder 140, the page buffer 150, or various other peripheral circuits and the memory cell array 110 are arranged in a stacking direction (e.g., the third direction), that is, a cell-on-peri (COP) or cell-over-peri (COP) structure. By disposing circuits other than the memory cell array 110 below the memory cell array 110, the COP structure may effectively reduce the area occupied on a surface perpendicular to the stacking direction, and thus the number of memory cells integrated in the memory device 100 may be increased.

Although not shown in FIG. 12, a plurality of pads may be arranged for electrical connection with a device outside the memory device 100. For example, a plurality of pads for a command CMD, an address ADDR, and a control signal CTRL received from a device outside the memory device 100 may be arranged, and a plurality of pads for inputting/outputting data DT may be disposed. The pads may be arranged close to peripheral circuits that process signals received from or transmitted to a device outside the memory device 100 in a vertical direction (the third direction) or a horizontal direction (the first direction or the second direction).

Figure 13:
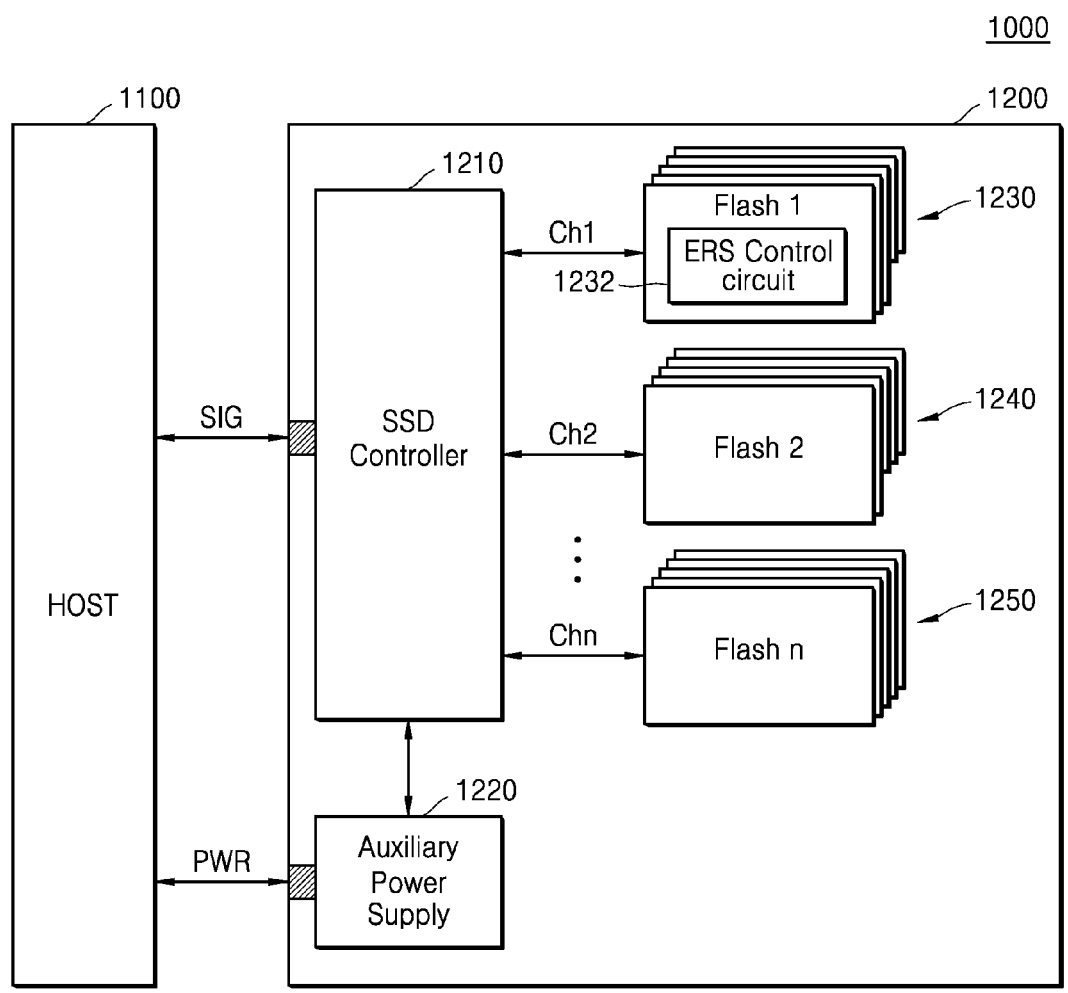
FIG. 13 is a block diagram of a solid-state drive (SSD) memory system that may utilize memory devices according to example embodiments of the invention.

FIG. 13 is a block diagram showing an example of applying a memory device according to example embodiments to a solid-state drive (SSD) system. Referring to FIG. 13, an SSD system 1000 may include a host 1100 and an SSD 1200. The SSD 1200 may exchange signals with the host 1100 through a signal connector and receive power through a power connector. The SSD 1200 may include an SSD controller 1210, an auxiliary power supply 1220, and memory devices 1230, 1240, and 1250. At this time, the SSD 1200 may be implemented according to the example embodiments described above with reference to FIGS. 1 to 12. Each of the memory devices 1230, 1240, and 1250 may include an erase control circuit 1232. Accordingly, during an erase operation, groups may be formed between bit lines, and erase voltages different from one another may be applied to the respective groups. Therefore, a skew between threshold voltage distributions after an erase operation may be enhanced, and thus data reliability may be improved.

As described above, example embodiments have been disclosed in the drawings and specification. Although embodiments have been described herein using specific terminology, it is understood that they have been used only for purposes of describing the inventive concept and not for limiting the scope of the inventive concept as defined in the claims. Therefore, one of ordinary skill in the art will appreciate that various modifications and equivalent embodiments are possible without departing from the scope of the inventive concept. Accordingly, the true scope of protection of the present disclosure should be determined by the technical idea of the appended claims.

What is claimed is:

1. A memory device, comprising:
   an array of non-volatile memory cells having a plurality of groups that are spaced apart from each other in a first direction and extending in a second direction perpendicular from the first direction;
   at least a first bit line electrically coupled to a first of the plurality of groups of non-volatile memory cells and extending in the second direction;

at least a second bit line electrically coupled to a second of the plurality of groups of non-volatile memory cells and extending in the second direction; and an erase control circuit configured to drive the at least a first bit line and the at least a second bit line with unequal first and second erase voltages that at least partially overlap in time during an operation to erase the first of the plurality of groups of non-volatile memory cells and the second of the plurality of groups of non-volatile memory cells, respectively.

2. The memory device of claim 1, wherein the non-volatile memory cells in the first of the plurality of groups of non-volatile memory cells are arranged vertically relative to each other, on an underlying substrate.

3. The memory device of claim 2, wherein said array of non-volatile memory cells comprises a plurality of vertical NAND strings of memory cells having respective vertical channel structures electrically coupled to corresponding bit lines; and wherein said erase control circuit is configured to drive a plurality of the bit lines with unequal erase voltages during an operation to erase the plurality of vertical NAND strings of memory cells.

4. The memory device of claim 3, wherein the unequal erase voltages include a first erase voltage and a second erase voltage having unequal magnitudes; and wherein said erase control circuit is configured to drive a first of the plurality of bit lines with the first erase voltage for a first duration and a second of the plurality of bit lines with the second erase voltage for a second duration during the operation to erase the plurality of vertical NAND strings of memory cells.

5. The memory device of claim 4, wherein the first duration is shorter than the second duration.

6. The memory device of claim 1, wherein a magnitude of the first erase voltage is less than a magnitude of the second erase voltage.

7. The memory device of claim 1, further comprising a word line cut region on the semiconductor substrate; and wherein the first of the plurality of groups of non-volatile memory cells extends closer to the word line cut region relative to the second of the plurality of groups of non-volatile memory cells.

8. A non-volatile memory device comprising:
a substrate;
a memory cell array comprising a plurality of vertical channel structures spaced apart from one another in a first direction and a second direction perpendicular to the first direction and extending in a direction perpendicular to the substrate;
a plurality of bit lines extending in the second direction and electrically connected to a respective one end of the vertical channel structures; and
an erase control circuit, which is configured to form a plurality of groups including at least two of the bit lines per group and to apply erase voltages, different from each other, to two or more of the groups, and that at least partially overlap in time during an erase operation for the memory cell array.

9. The non-volatile memory device of claim 8,
further comprising one or more word line cut regions formed on the substrate and extending in the first direction,
wherein the vertical channel structures electrically connected to bit lines included in a first group from among the groups are arranged closer to the word line cut regions than the vertical channel structures electrically connected to bit lines included in a second group from among the groups, and
the erase control circuit applies a first erase voltage to the first group and a second erase voltage that is different from the first erase voltage to the second group.

10. The non-volatile memory device of claim 9,
further comprising a voltage generator outputting the first erase voltage and the second erase voltage having different levels.

11. The non-volatile memory device of claim 9,
wherein the first erase voltage has a level lower than that of the second erase voltage.

12. The non-volatile memory device of claim 9,
wherein the first erase voltage has a first application time, and
the second erase voltage has a second application time that is different from the first application time.

13. The non-volatile memory device of claim 12,
wherein the first application time is shorter than the second application time.

14. The non-volatile memory device of claim 11,
wherein the erase control circuit comprises a plurality of transistors each including a first to third terminals,
control signals are applied to first terminals of the transistors,
the second terminals of the transistors are electrically connected to the bit lines, and
at least two of third terminals of the transistors are electrically connected each other and the erase voltage is applied thereto.

15. The non-volatile memory device of claim 14,
wherein the erase control circuit controls application times of erase voltages applied to the respective bit lines based on turn-on controls of the respective transistors.

16. The non-volatile memory device of claim 11,
wherein the erase operation comprises a first erase loop and a second erase loop, and
the erase control circuit applies different erase voltages to at least two of the groups in the second erase loop based on a result of the first erase loop.

17. The non-volatile memory device of claim 16,
wherein the erase control circuit applies different erase voltages to the at least two groups in the first erase loop.

18. The non-volatile memory device of claim 16,
wherein the erase control circuit applies same erase voltages to the at least two groups in the first erase loop.

19. A non-volatile memory device comprising:
a plurality of memory blocks disposed in a first direction and a second direction perpendicular to the first direction and each comprising a plurality of pillars extending in a direction perpendicular to a substrate;
a plurality of bit lines extending in the second direction on the memory blocks and electrically connected to the pillars, respectively;
one or more word line cut regions formed on the substrate and extending in the first direction;
control logic for outputting an erase voltage control signal during an erase operation for the memory blocks; and
an erase control circuit configured to form a first group and a second group each comprising at least two of the bit lines and to apply a first erase voltage having a first magnitude to the first group and a second erase voltage having a second magnitude, which is unequal to the first magnitude and at least partially overlaps in time with the first erase voltage, to the second group, in response to the erase voltage control signal.

20. The non-volatile memory device of claim 19, wherein the erase control circuit comprises a plurality of transistors, one ends of which are electrically and respectively connected to the bit lines, wherein turn-on/turn-off of the transistors is controlled based on the erase voltage control signal, and, during the erase operation, a turn-on time of transistors electrically connected to the bit lines included in the first group is different from a turn-on time of transistors electrically connected to the bit lines included in the second group.

\* \* \* \* \*